US006272661B1

(12) United States Patent
Yamaguchi (10) Patent No.: US 6,272,661 B1
(45) Date of Patent: Aug. 7, 2001

(54) MINIMUM MEMORY IMPLEMENTATION OF HIGH SPEED VITERBI DECODER

(75) Inventor: Hirohisa Yamaguchi, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/222,027

(22) Filed: Dec. 29, 1998

(51) Int. Cl.[7] .................................................. H03M 13/03
(52) U.S. Cl. ......................... 714/795; 714/786; 714/796
(58) Field of Search ................................... 714/795, 796, 714/786, 792, 793, 794

(56) References Cited

U.S. PATENT DOCUMENTS

| | | | |
|---|---|---|---|
| 4,757,506 | * 7/1988 | Heichler | 371/43 |
| 4,829,575 | * 5/1989 | Lloyd | 381/41 |
| 5,095,484 | * 3/1992 | Karabed et al. | 371/30 |
| 5,144,644 | * 9/1992 | Borth | 375/96 |
| 5,331,665 | * 7/1994 | Busschaert et al. | 375/94 |
| 5,410,556 | 4/1995 | Yeh et al. | 371/43 |
| 5,432,803 | * 7/1995 | Liu et al. | 371/43 |
| 5,502,736 | 3/1996 | Todoroki | 371/43 |
| 5,509,021 | 4/1996 | Todoroki | 371/43 |
| 5,539,757 | * 7/1996 | Cox et al. | 371/43 |
| 5,588,028 | 12/1996 | Parizhsky | 375/341 |
| 5,608,737 | 3/1997 | Kimura et al. | 371/30 |
| 5,646,950 | * 7/1997 | Varanasi et al. | 371/43 |
| 5,867,408 | * 2/1999 | Chauvel et al. | 364/715.06 |
| 5,946,361 | * 8/1999 | Araki et al. | 375/341 |
| 5,996,112 | * 11/1999 | Dabiri et al. | 714/795 |
| 6,108,374 | * 8/2000 | Balachandran et al. | 375/227 |

FOREIGN PATENT DOCUMENTS

WO 95/01032  1/1995  (WO) ........................... H04L/25/02

OTHER PUBLICATIONS

Droma & Zeng. "Memory savings in Viterbi decoders for (n, 1, m) convolutional codes". Electronics Letters. Oct. 9, 1997. vol. 33 Issue 21. pp. 1758–1759.*

* cited by examiner

*Primary Examiner*—Albert Decady
*Assistant Examiner*—Samuel Lin
(74) *Attorney, Agent, or Firm*—Ronald O. Neerings; Wade James Brady, III; Frederick J. Telecky, Jr.

(57) ABSTRACT

A Viterbi decoder is disclosed that utilizes minimum memory for the decoding operation. A plurality of FIFOs are provided which are divided into two blocks of FIFOS, one for upper states and one for lower states. The operations are calculated utilizing previously stored branch metrics and then determining the new branch metric by retrieving information from the FIFOs, adding the new branch metric defined with the soft decision table and then selecting the most likely path therefrom, and discarding the other. This new branch metric is then stored back into the FIFOs to replace the old. Each branch metric calculation results in a determination of the most likely path for that state and also the decoded data bit for a given state associated with a received symbol. This is stored in a separate memory for each of the nodes, and thereafter, the output is decoded to retrieve the decoded bit stream.

26 Claims, 8 Drawing Sheets

MINIMUM MEMORY IMPLEMENTATION OF HIGH SPEED VITERBI DECODER

TECHNICAL FIELD OF THE INVENTION

The present invention pertains in general to maximum-likelihood decoders and, more particularly, to a Viterbi decoder structure utilizing minimal memory.

BACKGROUND OF THE INVENTION

In digital communications systems, received data may have been corrupted by noise and distortion. As such, digital data obtained at the receiving station may not be an accurate replica of the data transmitted. Such errors may be reduced by encoding the transmitted data to add redundancy to the data before transmission.

Redundancy may be introduced by increasing the symbol rate. For example, error checking and error correcting codes may be appended to fixed-length blocks of source data and the combination then sent at a higher data rate. The resulting increase in bandwidth, however, subjects the receiver to additional noise.

As an alternative, signal-space codes may be utilized to add redundancy by converting the source data into a "line code" which may be sent at the same symbol rate but which utilizes an enlarged number of possible symbols (discrete points within the signal space). The bandwidth required by such codes is no larger than that of an equivalent encoded system, such that there is no increase in noise at the receiver. However, due to the fact that symbols must be more closely spaced to avoid an increase in transmitted power, noise immunity is reduced. In transmission systems having a limited, fixed bandwidth, such as a voice-grade telephone link, signal-spaced coding permits significantly higher rates of error-corrected transmission to be realized.

One class of signal-spaced code which has seen increasing acceptance due to its superior performance is the "trellis code," a convolutional code best explained utilizing a trellis diagram. In the trellis diagram, vertical columns of nodes represent the possible states which can be assumed at successive points in time by a "state machine" which encodes the source data. Before transmission begins, the encoding machine is initialized to a predetermined state. Thereafter, each transmitted symbol specifies the transition from the current state to a limited number of permissible successor states. The sequence of symbols previously transmitted specifies the current state of the encoding machine. The current state in turn specifies which symbols out of the entire alphabet may validly appear next in the transmitted sequence. Thus, only selected sequences of transmitted symbols are permitted by the coding scheme and these legitimate sequences may be represented by paths through the trellis diagram.

Each transmitted symbol accordingly represents not only a source code, but also contains historical information, reflected in the state information which can be derived from the received sequence of symbols. This redundancy permits the transmitted symbol sequence to be accurately reconstructed in a decoding operation even though noise and distortion have altered the message-bearing signal during transmission.

Trellis coding is utilized to particular advantage in the implementation of voice band data modems of the type used to provide high, error-free data rates over dial-up and leased line analog telephone facilities. In order to process these structures, the highly efficient Viterbi algorithm has been utilized, named after its originator, A. J. Viterbi. The Viterbi technique makes use of the fact that a number of the transitions to a given state can be deleted, as they do not represent the least-likely path to that transition. In this matter, a lower number of transitions is required to be stored when determining the most likely path between states.

SUMMARY OF THE INVENTION

The present invention disclosed and claimed herein comprises a method for decoding an encoded data sequence with the Viterbi algorithm, wherein convolutionally encoded symbols are transmitted and received. The encoded data is received wherein the encoded data sequence has a known state at the end of the sequence. A table of information nodes is built for each received symbol and each state of the convolutional encoding process. There are M states and M nodes and, for each state and corresponding node associated with each received symbol, there is associated therewith both a decoded data bit and a path pointer to the most likely state and corresponding node associated with the preceding received symbol. The decoded data word from the information in the table is extracted from the table. This is achieved by first selecting from the table associated with the last received symbol at the end of the sequence a node corresponding to a known state therefor that constitutes a selected node. The data bit is then extracted from the select node and appended to an encoded data word. A path is traversed from the selected node for the associated symbol to the state and corresponding node of the preceding symbol indicated by the path pointer for the selected node. The steps of extracting and traversing are repeated for each received symbol until the data for the first symbol is examined and the associated decoded data bit is appended to the decoded data word.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
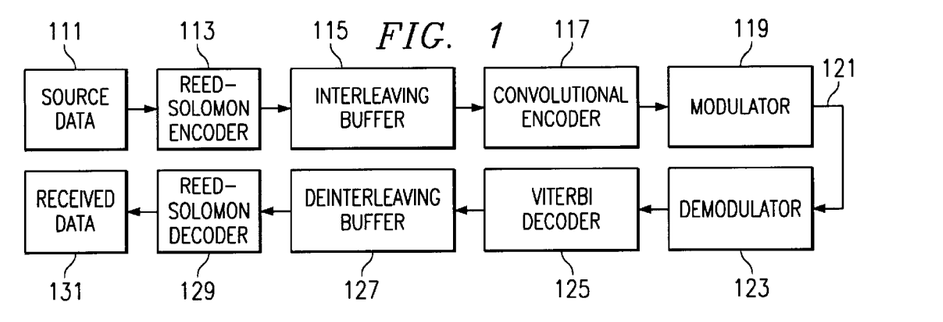
FIG. 1 illustrates a block diagram of a concatenated encoder/decoder configuration for transmission of data over a wireless link.

Referring now to FIG. 1, there is illustrated a block diagram of a data processing system for receiving source data, encoding that source data, transmitting the source data over a wireless link, and decoding the received data to provide decoded data. In the embodiment illustrated in FIG. 1, the system utilizes a convolutional code. The source data is received at block 11, which is then encoded with a Reed-Solomon encoder. This is passed to a symbol interleaving buffer 15 to a convolutional encoder 17. The signal that is output by the convolutional encoder is then input to a modulator 19 for transmission over a communication link 21, which can be any type of communication link including a wireless communication link. However, it is noted that this communication link or channel 21 requires some type of error correction capability due to the error-prone channel characteristics which is provided in part by the Reed-Solomon encoder 13. Information bits from the data source are grouped into blocks of m to create the $2^m$-ary symbol alphabet used by the Reed-Solomon code. This is the "outer code" of a concatenated code system. The output symbols of the Reed-Solomon encoder 13 are converted to their m-ary binary representations and input to the symbol interleaving buffer 15. This buffer 15 enables the spreading of bursts of channel symbol errors over Reed-Solomon code words as uniformly as possible.

The modulated signal is received at the receiver in a de-modulation block 23, which is then processed through a Viterbi decoder 25 in order to decode the symbols that were encoded by the convolutional encoder 17. The convolutional code is the "inner code" of the system. The output of the Viterbi decoder is an estimate of the binary sequence that was input to the encoder. These decoded symbols are then output to a de-interleaving buffer 27 and then passed to the Reed-Solomon decoder 29 to provide decoded data. This is represented by a block 31 as received data.

A convolutional encoder is operable to encode the data utilizing conventional convolutional coding techniques. These coding techniques are a class of codes in which the encoder accepts data in groups of k symbols (quite often k=1) and provides encoded output data in small groups of n (n>k) symbols with the property that each output group depends not only on the k input at that time, but also on several preceding input groups; that is, the encoder has memory.

Figure 2:
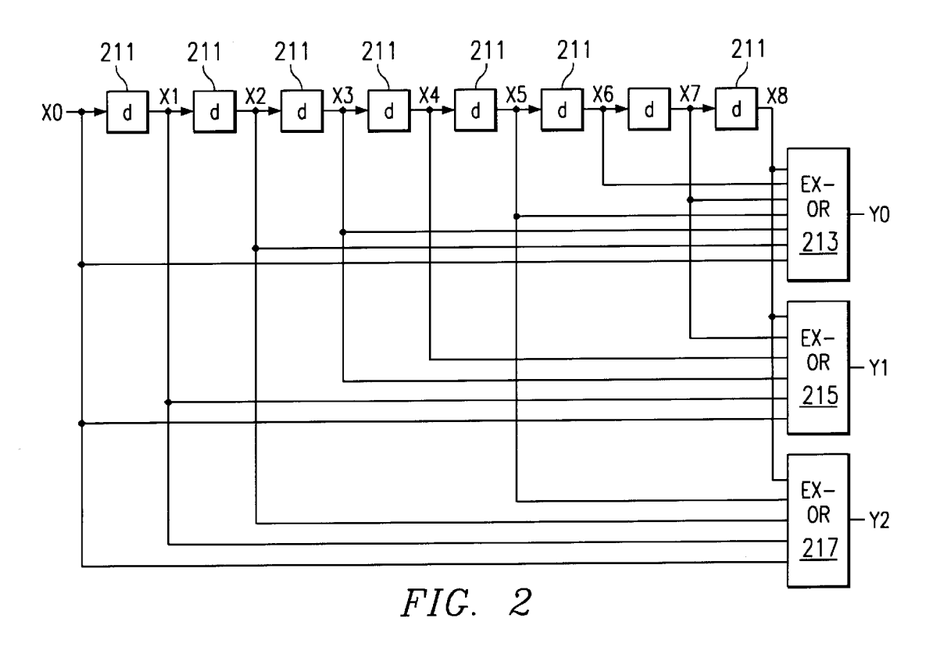
FIG. 2 illustrates a block diagram of a convolutional encoder.

Referring now to FIG. 2, there is illustrated a block diagram of a convolutional encoder. In this encoder, there are provided eight (8) shift registers 211, connected in series, with the first of the shift registers 211 receiving the input bit X0 on the input thereof and providing on the output thereof X1. This subsequent shift register 211 provides on the outputs thereof X2, X3 . . . X8. The input X0 and the output of the second, third, fifth, seventh, and eighth shift registers 211 are input to an exclusive OR (EXOR) gate 213 to provide on the output thereof the output Y0. Similarly, the input X0 and the output of the second, third, fourth, seventh, eighth shift registers 211 are input EXOR gate 215 to provide on the output thereof Y1. A third EXOR gate 217 has connected to the input thereof X0 input and the output of the first, second, fifth, and eighth shift registers 211, the output of EXOR gate 217 providing the Y2 output. The relationship for this shift register is defined as follows:

Y0=X0⊕X2⊕X3⊕X5⊕X6⊕X7⊕X8
Y1=X0⊕X1⊕X3⊕X4⊕X7⊕X8
Y2=X0⊕X1⊕X2⊕X5⊕X8

Therefore, for each shift of the clock controlling the shift registers 211, there will be output a three bit code, this representing a "symbol." Each of these three bit symbols depends on the input bit and the outputs of each of the registers. In essence, this a state machine having a number of state bits which, when added together, define the constraint length, which is eight in this embodiment. The rate R is defined as the number of bits for each state of the input, this being one, divided the number of output bits to define that input bit, this being three in the present example. Therefore, the rate is ⅓.

As noted above, once the data is encoded utilizing a convolutional encoding algorithm, symbols are output, each representing a single input bit in the context of surrounding bits. In general, the structure and characteristics of convolutional codes can alternate utilizing a trellis diagram. Consider a state machine having two registers which will result in $2^2$ states of 00, 01, 10, and 11. Each of these states can make the transition to another state which transitions are set forth in FIG. 3. The encoding algorithm will result in symbols 01,00,10, and 11. This basically constitutes a convolutional encoder with the constraint length of three and a rate of ½. It should be noted that if the constraint length were eight, there would be 256 states. The convolutional encoder is illustrated such that the symbols resulting in the transitions between states are illustrated on the arrows. Initially, the encoder is initialized to "0," with that the two internal registers or states are set to a value of "0" such that the initial state is "00."

Figure 4:
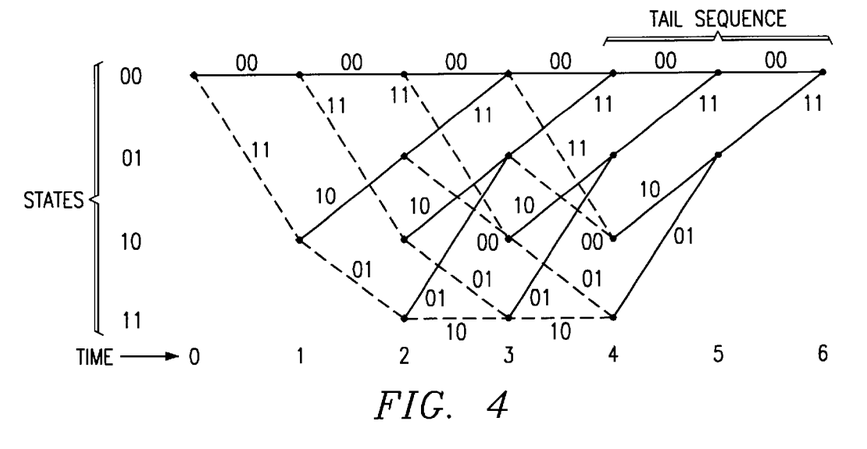
FIG. 4 illustrates a trellis diagram for the simplified convolutional encoder of FIG. 3.

Referring now to FIG. 4, there is illustrated a trellis diagram in which there is illustrated a sequence of data bits passed through the encoder wherein a tail sequence of two "zeros" is added to the data word. Solid lines represent a "0" encoder input and the dashed line represents a "1" encoder input. In this configuration, it can be seen that, when the encoder is initialized at a "0" state, then the sequence of symbols that is output and the various states of the encoder can be seen with this trellis diagram.

The Viterbi decoding algorithm is a path maximum, likelihood decoding approach for convolutional codes that takes advantage of the reemerging path structure illustrated in the trellis representation. This is best illustrated with reference to FIGS. 5A, 5B, 6A, 6B, 6C, 7A, 7B, and 7C. These FIGURES illustrate the progression through the decoder trellis diagram for a hard-decision decoder and a particular received sequence. The branches in the trellis diagrams are labeled with the normalized branch metrics, with are equal to the number of bits in which the received symbols at that branch differ from the encoder output symbols that are noted in the corresponding encoder trellis representation in FIG. 4.

Figure 5A:
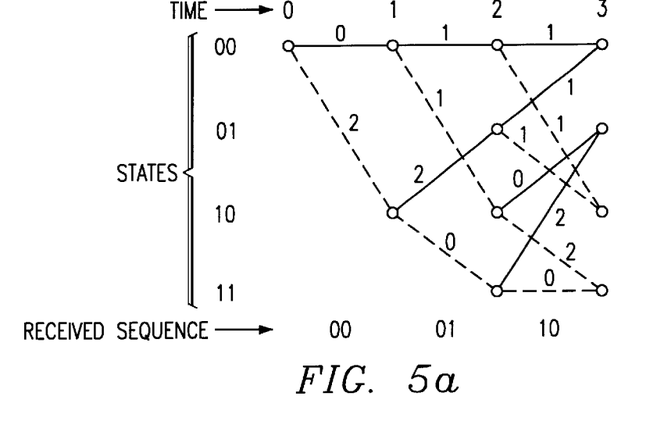
FIGS. 5a and 5b illustrate the trellis diagram for the Viterbi decoder for three branches.

With reference to FIG. 5A, it can be seen that for the first transition in the received sequence there will be the first symbol "00" which will have no difference between the state transition from state "00" to state "00." However, the other allowable transition is from state "00" to state "10" which corresponds to the symbol "11." This will result in a branch metric difference of two bits. In the first two branches, the decoder merely accumulates branch metrics to obtain $2^{k-1}$ path metrics wherein K is the constraint length of three. This results in four possible paths. After three branches, the paths will begin to re-merge, as illustrated in FIG. 5A. A Viterbi decoder compares the path metrics of the two paths entering each node and eliminates with the worst (largest in this example) metric. This results in the trellis diagram of FIG. 5B after three branches corresponding to three received symbols.

Each time a new branch of n channel symbols is received, the Viterbi decoder will computer $2^K$ path metrics by adding the branch metrics to the $2^{K-1}$ previously computed path metrics. Then, $2^{K-1}$ comparisons are made between the two paths entering each state and only the path with the best metric in each node is retained. This procedure is illustrated in FIGS. 6a–6c.

Figure 5B:
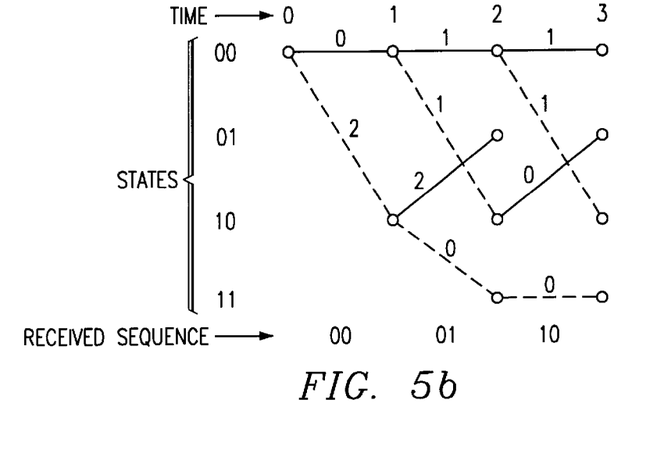
Figure 6A:
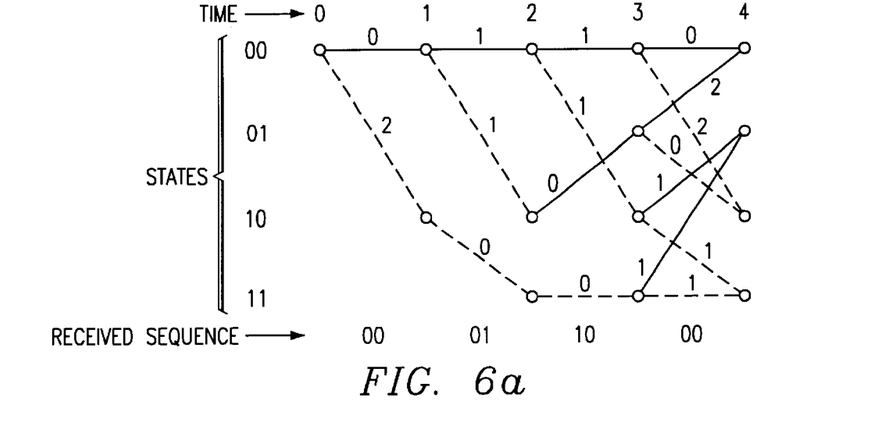
FIGS. 6a–6c illustrate the trellis and the Viterbi algorithm for four branches.
Figure 6B:
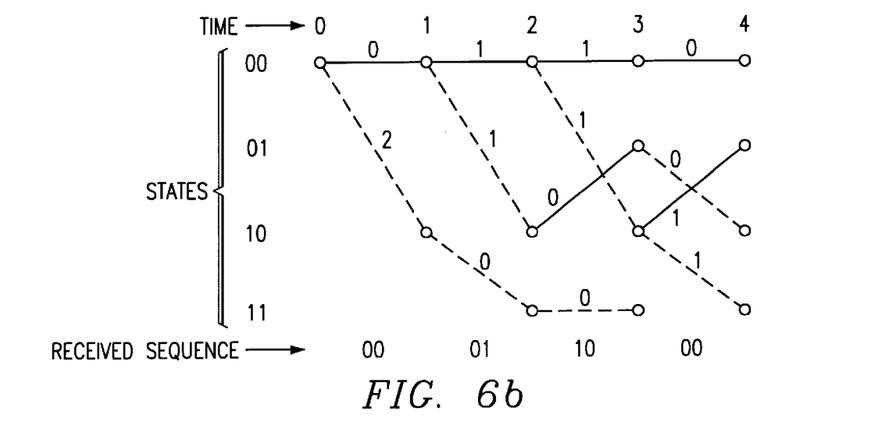
Figure 6C:
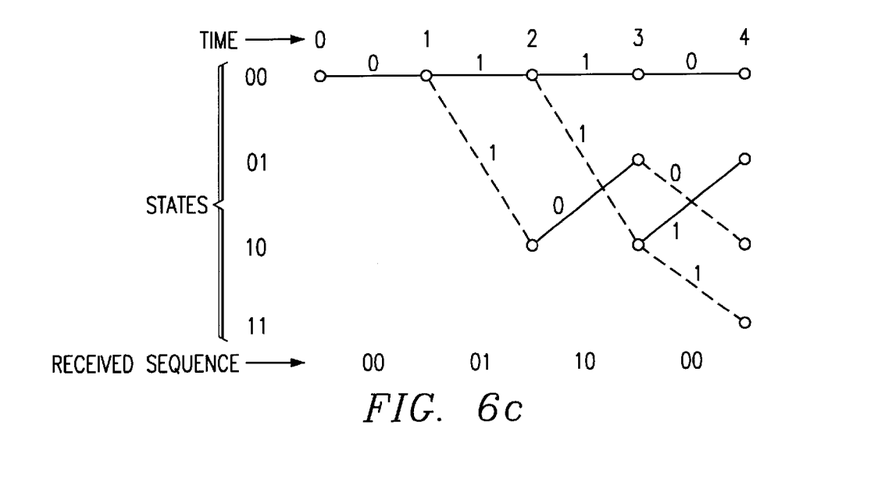

In FIG. 6a, there is illustrated the additional, or fourth, branch added to the trellis diagram of FIG. 5b after elimination via the Viterbi algorithm. FIG. 6b illustrates the elimination of the worst paths and FIG. 6c illustrates a simplification wherein another of the worst paths is eliminated. At this point, it can be seen that all the paths have merged in the first branch to the state transition from "00" to "00" wherein the decoder can make a decision that this coincided with a "0" encoder input such that the output will be a "0."

Figure 7A:
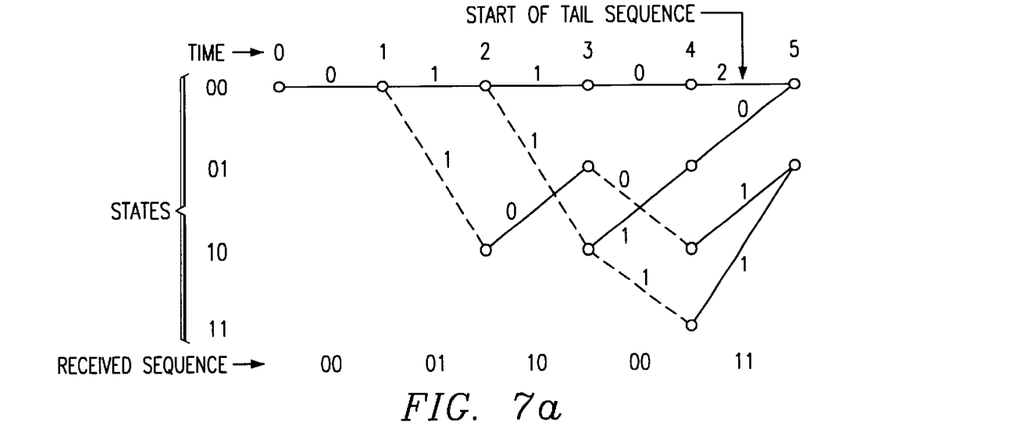
FIGS. 7A–7C illustrate the trellis diagram in accordance with the Viterbi algorithm.
Figure 7B:
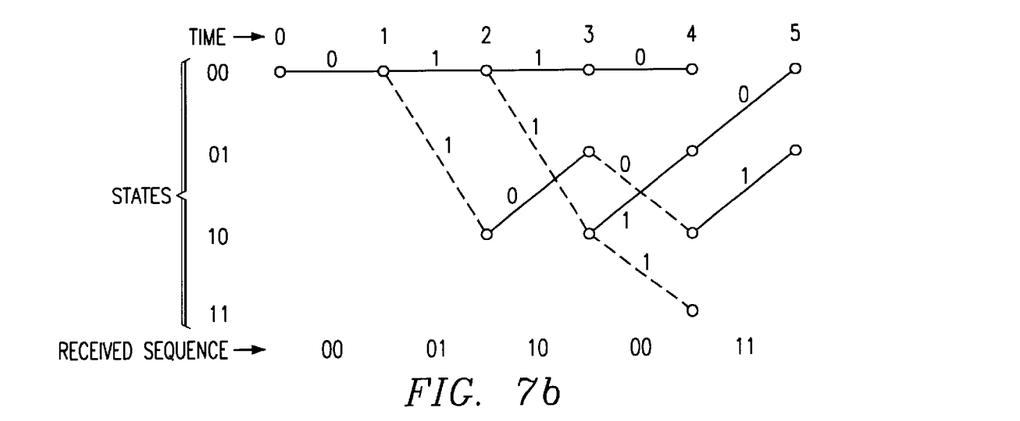
Figure 7C:
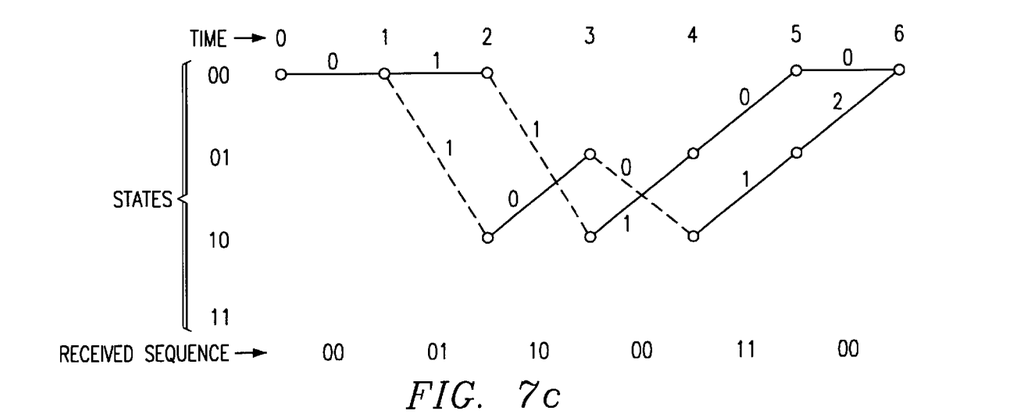

Referring now to FIGS. 7a–7c, the tail sequence is noted as beginning at the fifth branch. Since it is known that these are "0"s, only the "0" paths are illustrated and these are the only paths that are extended. FIG. 7b illustrates the trellis after the comparison, wherein only two paths remain. FIG. 7c illustrates the sixth and final branch, only showing the extensions for the "0" input bit. When the branch metrics are added up for both paths, it can be seen that the upper path is the one selected and the final complete decoder output sequence is "001000."

Eventually, as illustrated in the example of FIGS. 4–7c, the paths all merge into the all-0-state node, and the Viterbi decoder is left with a single most-likely path. In practice, convolutional codes are usually utilized with arbitrarily long sequences of data without a tail sequence. In such an application, whenever the decoder is given a new branch of N-quantized received signals, it provides an estimate of the information bit which corresponds to some branch that is fixed number of branches in the past. This is accomplished by picking the current state that corresponds to the path with the best path metric, and then tracing this path back through the trellis for some of the branches m (called the path memory), and finally providing as an output the information that corresponds to that branch. This approach means that only m bits need be retained for each of the $2^{K-1}$ paths. Since the retained paths tend to re-merge a few constraint length of branches back, a memory larger than this has little impact on the performance. It is also possible to achieve the performance by tracing back from an arbitrary current state, if a larger path memory is provided. When paths are traced back from a current maximum-likelihood state, a path memory of about five constraint lengths or branches is a good choice for R=1/2 codes. Slightly smaller path memories are suitable with a lower-rate codes and larger memories are required with higher-rate codes.

Figure 3:
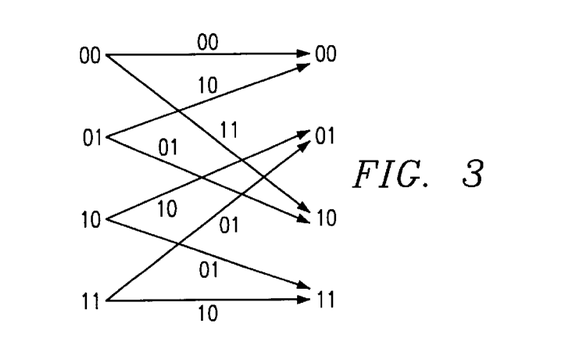
FIG. 3 illustrates a transition diagram for a simplified convolutional encoder.

In the above-noted example with the convolutional decoder set forth in the transition diagram of FIG. 3, all of the symbols were transmitted with no error. When there are no errors, the path branch metrics, i.e., the metric for the branch, for each branch in the path can be determined by calculating the distance between the symbol associated with the transition between two states for a given branch and the actual received signal. However, if the information received does not exactly correspond to a given symbol within the symbol space, then the distance between the actual received information of the symbol and each of the symbols is calculated. Once all of the branch metrics have been determined for a given path, then the "path metric" can be determined which is defined by the sum of branch metrics between a legitimate path through the trellis and the actual signal values received.

In the Viterbi decoder, the object of the decoder is to find the most likely data sequence that is output by the convolutional encoder. The convolutional encoder of the disclosed embodiment of FIG. 2 has eight registers which must be mapped into 256 ($2^8$=256) different states wherein the state transition is traced according to the received triplet data associated therewith (Y0, Y1, Y2), these being the symbols. The internal state of the convolutional encoder is then defined by:

$$S(X1,X2,--,X8)=X1+2*X2+4*X3+\cdots+128*X8$$

In order to run the Viterbi decoder, the initial state of the convolutional encoder (values in the eight registers 211) is assumed to be "0." Also, in order to terminate the Viterbi decoder in a known state, eight "0"s are added at the tail of the input data and the corresponding encoded data (eight symbols) are also transmitted.

Figure 8:
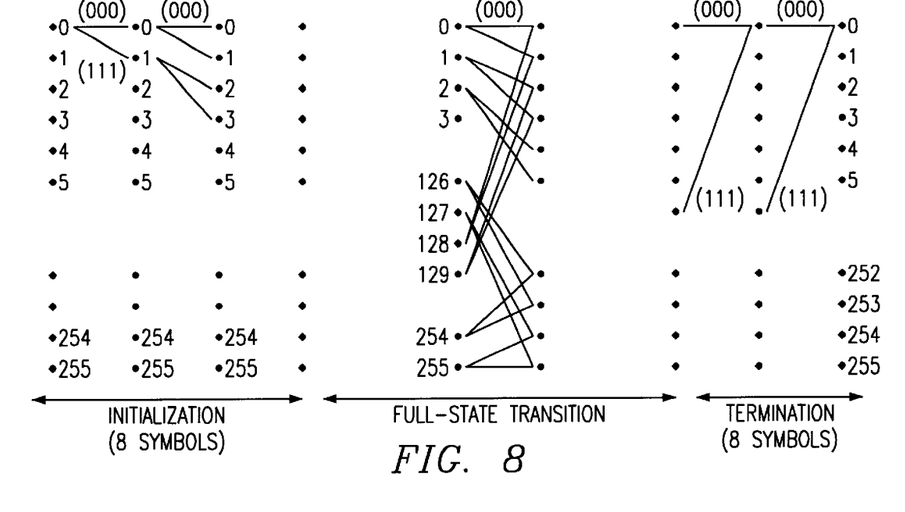
FIG. 8 illustrates a state transition diagram representing the Viterbi decoding.

Referring now to FIG. 8, there is illustrated the state transitions in the trellis diagram from the initialization of eight symbols and the termination of eight symbols. As illustrated, the system will be initiated in state "0" and the only possible transitions therefrom will be to state "0" or to state "1" for he first symbol. If a symbol "000" is transmitted, the transition will be from state "0" to "0." If a symbol "111" is transmitted, this will represent a transition from state "0" to state "1." However, if there is an error and one bit was flipped such that the incoming symbol was "010", this would result in an error. To account for the branch metrics, distance is computed in the Hamming distance such that the branch metric for each of the branches would be: D(010,000)=1ND(010,111)=2.

In the Viterbi decoder, judgement of the incoming data is not made in one transition alone; rather, the decoding operation is continued until all of the incoming symbols are decoded and the cumulative distance, i.e., the path metric, is compared with all the other candidate with different state-transition traces. The number of the possible state-transitions traces does not increase explosively because it is bound by the number of shift registers in the convolutional encoder and the number of associated states (256).

Referring further to FIG. 8, after the initial 8 symbol periods associated with the initialization operation, full state transitions occur between the 256 states for each symbol received. In this operational phase, each left node has 2 departing branches and each right node has 2 arriving branches. Selection of one of the incoming branches is made according to the cumulative distance. This maintains the maximum transition nodes to 256 for a given received symbol. It then follows that the maximum number of traces that need to be compared in the Viterbi decoding is also 256 and there are also 256 cumulative distances associated with each trace. The cumulative distance is the Viterbi path metric.

In general, the distance between the incoming symbol (3 bits) and a legitimate symbol can be computed by either hard-decision (for example, by the Hamming distance) or by soft-decision. Utilizing the soft-decision, the following Table 1 illustrates the relationship between the received bit amplitude and the decision whether the received bit is a "0" or a "1," this defined in a case where noise is Gaussian.

TABLE 1

Example of Distance for Soft-Decision

| Received Bit Amplitude | 0 | 1 |
|---|---|---|
| $0_{LL}$ | 1 | 12 |
| $0_L$ | 2 | 10 |
| $0_H$ | 2 | 8 |
| $0_{HH}$ | 4 | 6 |
| $1_{LL}$ | 6 | 4 |
| $1_L$ | 8 | 2 |
| $1_H$ | 10 | 2 |
| $1_{HH}$ | 12 | 1 |

Figure 9:
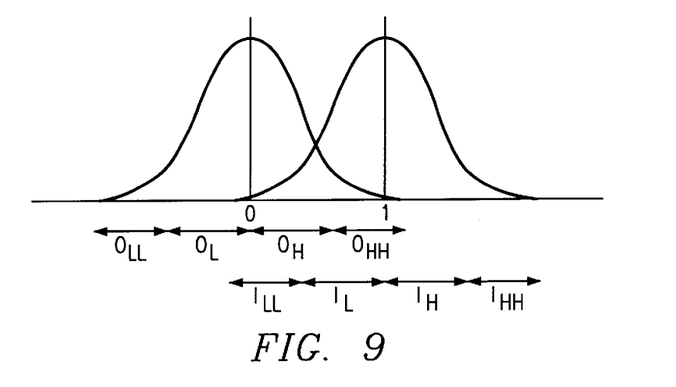
FIG. 9 illustrates a plot utilized for defining for distance definition in a soft decision.

It can be seen that the soft-decision penalty between, for example, a signal having an amplitude in the range $0_L$ and a 1 is approximately the value of 10. For a "0", the penalty is 2. Due the fact that this extension of the distance can be easily incorporated into the Viterbi decoding algorithm, only the hard-decision decoding will be explained in the disclosed embodiment hereinbelow. The Gaussian distribution is illustrated in FIG. 9.

In Table 2 attached as appendices, there is illustrated the state transitions for each of the states from the left node to a right node. Since there are two right nodes for each left node, they are termed input=0 and input=1. Corresponding symbols are shown within ( ) as Y0+2*Y1+4*Y2. From this table, it can be seen that following relationship holds between the left-node metric and the right-node metric:

$$\text{metric}(2N)=\min[\text{metric}(N)+d(\text{symbol}, m(N)), \text{metric}(N+128)+d(\text{symbol}, 7-m(N))] \quad (3)$$

$$\text{metric}(2N+1)=\min[\text{metric}(N)+d(\text{symbol}, 7-m(N)), \text{metric}(N+128)+d(\text{symbol}, m(N))] \quad (4)$$

In the above-noted equations 3 and 4, "symbol" stands for the received symbol and m(N) is the convolutional encoder output for the state N and input 0.

Figure 10:
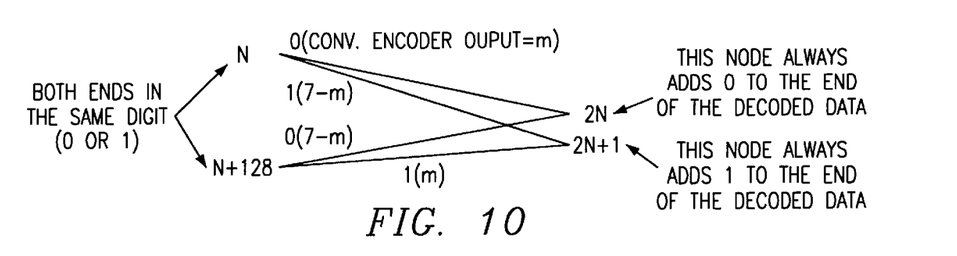
FIG. 10 illustrates a diagrammatic view of the relation of left-node metric and right-node metric in the disclosed embodiment.

Referring now to FIG. 10, there is illustrated a diagrammatic view of equations 3 and 4. It can be seen that for both N and N+128 that there exists a cumulative path metric. When traversing to one of the nodes 2N and 2N+1 from the nodes N and N+128, respectively, there must be a new "distance" or branch metric computed. These branch metrics are the soft decision values described above with respect to Table 1. These are determined by comparing the actual bit level of the symbol received with the locally generated convolutional code for the transition. It is noted that at the 2N node, i.e., for all even nodes, the decoded data will be a "0" bit and at the 2N+1 node, i.e., for all the odd nodes, the data will be "1." These will be the bits added to the decoded data for that particular path.

Figure 11:
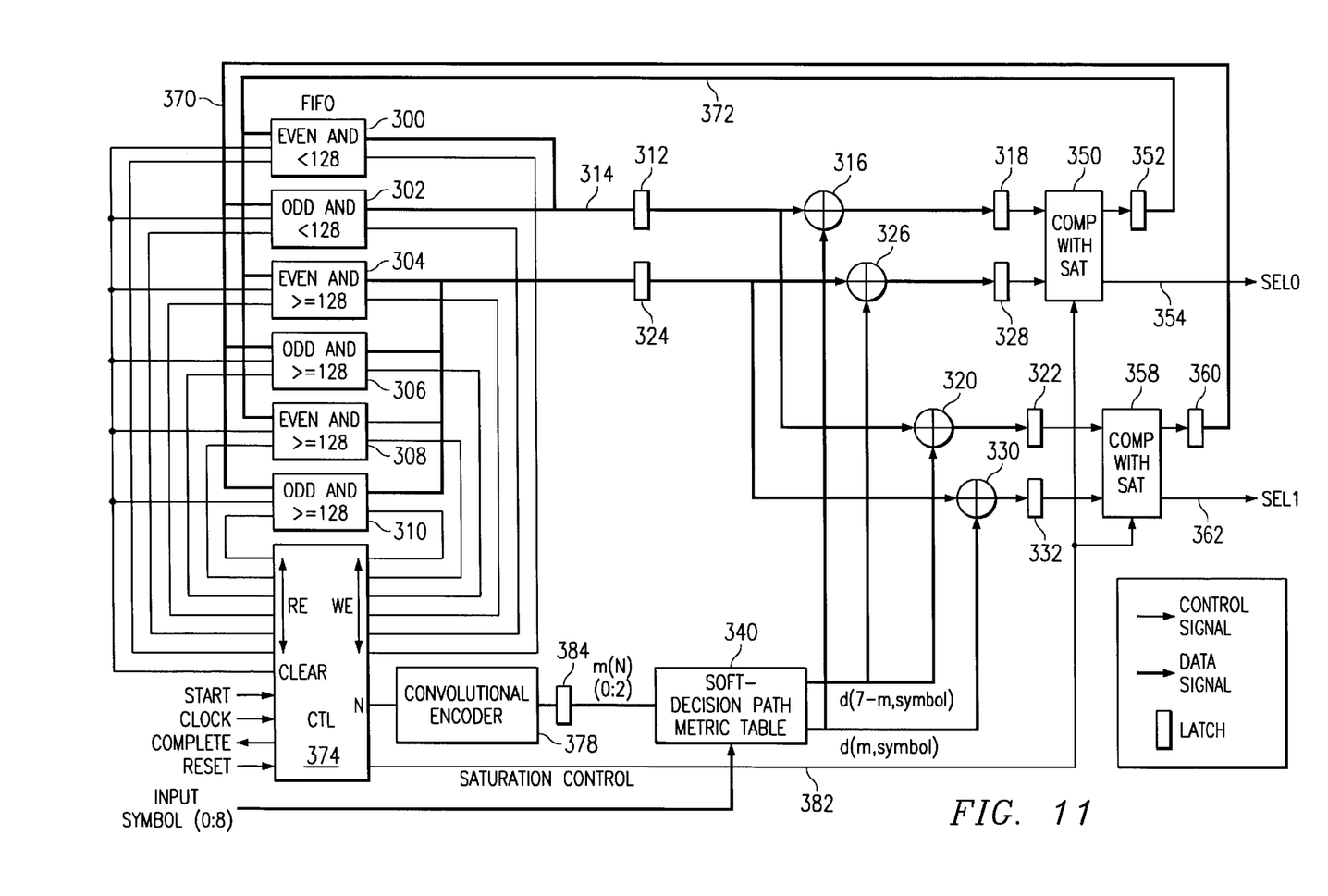
FIG. 11 illustrates a Viterbi decoder loop.

Referring now to FIG. 11, there is illustrated a block diagram of a portion of the Viterbi Decoder Loop for determining the interim path metric values and storing those interim path metric values. In the portion of the Viterbi Decoder illustrated in FIG. 11, there are provided a plurality of First-In, First-Out (FIFO) memories. The memory space is divided in equal 64-word segments, each 64-word segment stored in one of the FIFOs labeled 300 for that associated with the even nodes having a value less than 128, FIFO 302 associated with the odd numbered nodes having a value less than 128, a FIFO 304 associated with even numbered nodes with a value greater than or equal to 128, a FIFO 306 associated with odd numbered nodes having a value greater than or equal to 128, an overflow FIFO 308 associated with even nodes having a value greater than or equal to 128, an overflow FIFO 310 associated with odd numbered nodes having a value greater than or equal to 128. The output of the FIFOs 300 and 302 are selectable and input to a latch 312 through a bus 314. The output of latch 312 is input to one input of a summing junction 316, the output thereof input to a latch 318. The output of latch 312 is also input to a summing junction 320, the output thereof input to the latch 322. The output of FIFO 304, 306, 308 and 310 are all selectably input to a latch 324. The output of latch 324 is input to a summing junction 326, the output thereof input to a latch 328. The output of latch 324 is also input to the input of the summing junction 330, the output thereof input to latch 332. The summing junction 316 and the summing junction 330 both have a second input connected to the output of the soft-decision path metric table 340 to receive the output d(m(N), symbol), and the summing junctions 326 and 320 have the second input thereof connected to an output of the table 340 associated with the value d(7−m(N), symbol).

The output of latches 318 and 328 are input to a block 350 which is operable to compare the contents of the two latches 318 and 328 to determine which is the lower value. This value, the new branch metric for that node, is then stored in latch 352. In addition, there is provided a single bit output on a line 354 representing the results of the comparison. This is entitled the SEL0 output. The latches 322 and 332, similarly, are input to a block 358 which is operable to compare the output of the contents of the latches 322 and 332 and then store the lower value one thereof in a latch 360. Block 358 is also operable to output a single value on a line 362, which is labeled SEL1. The output of latch 352 is input to the inputs of FIFOs 300, 304 and 308 through a bus 372. The output of latch 360 is input to the inputs of FIFOs 302, 306 and 310 through a bus 370. The operation of each of the FIFOs 300–310 is controlled by a control block 374 which is operable to generate the Read and Write controls for storing information in the select one of the FIFOs 300–310 and extracting information therefrom, as will be described hereinbelow. In addition, the control block 374 receives a Start signal and also a Reset signal. It is also operable to generate a Complete signal as an output signal. The control circuit 374 will also generate the N values, which are then input to a convolutional encoder 378. The output of convolutional encoder 378 is stored in a latch 384 as a 3-bit value for input to the block 340. Soft-decision path metric tables are stored in block 340 for d(m(N), symbol) and d(7−m(N), symbol), respectively. Note that m(N) and 7−m(N) is the 1's compliment relation and the 7−m(N) can be easily obtained from m(N).

For the initial path metric values, previous path metric values need to be defined. In Viterbi decoding, the previous metric (N) and metric (N+128) values are set to maximum except metric (0), which is set to a value of zero. This is enabled by a saturation control on a control line 382, which is input to both blocks 350 and 358.

The results for the calculation of the metric (2N) constitutes an even value which will be stored in the even FIFO 300, and the even FIFO 304 or the even FIFO 308. The even FIFO 308 and odd FIFO 310 are provided for retaining previous information, as will be described hereinbelow. Therefore, when one of the even FIFOs 304 or 308 is written with new path metric values, the other of the even FIFOs 304 and 308 maintains the previous path metric values. This is also the case with the odd FIFOs 306 and 310 for a calculation of the metric(2N+1).

Referring further to FIG. 11, the comparator 350 is operable to compare the values in the latches 318 and 328. The latch 318 contains the value associated with the previous path metric for N being odd or even plus the value d(m(N), symbol). The latch 328 stores the sum of the previous path metric, metric (N+128), and the value d(7−m (N), symbol). These two values are compared and the most likely metric value, the lowest value, is then written back into the appropriate one of the FIFOs 300–310. It is noted that the registers 300 and 302 are clocked on a first clock cycle to the latch 312 and then the metric computed and stored in the latch 318 on the next clock cycle. It is important to alternate between the redundant and non-redundant FIFOs 304; 308 and 306; 310 for the values of N greater than or equal to 128. This is to ensure that the previous path metric values are not written over. This is illustrated in the following Table 3 for the Read operations $R_N$ for N<128 and $R_{N+128}$ for N≧128 with the Write operations for the 2N path, $W_{2N}$ and the 2N+1 path, $W_{2N+1}$:

TABLE 3

| $R_N$ | $R_{N+128}$ | $W_{2N}$ | $W_{2N+1}$ |
|---|---|---|---|
| 127 | 255 | 254 | 255 |
| 126 | 254 | 252 | 253 |
| 125 | 253 | 250 | 251 |
| . | . | . | . |
| . | . | . | . |
| . | . | . | . |
| 63 | 191 | 126 | 127 |
| 62 | 190 | 124 | 125 |
| . | . | . | . |
| . | . | . | . |
| . | . | . | . |
| 0 | 128 | 0 | 1 |

With this structure, it can be seen that N is decremented from 127 to 0 and then it can be immediately written over. However, the Read operations and Write operations from the FIFOs associated with the N≧128 values will be Read from and Written to different FIFOs. This is due to the fact that the N>128 FIFOs need only be read once for a given node computation and there may be a conflict with the N≧128 FIFOs due to the fact that will be used again during the same node computation. With this structure calculating both of the Equations 3 and 4, there only needs to be redundant FIFOs for the N≧128 FIFOs, thus reducing the number of memories required. Further, the use of FIFOs allows for faster Reading and Writing with less storage of the path metrics when implementing a Viterbi algorithm.

The comparators 350 and 358 are operable to select the output of the one of the associated latches 318 and 328 or 322 and 332, respectively, for output to the respective latches 352 and 360. In addition, they are operable to output the SEL0 and SEL1 signals. The SEL0 signal is a logic "0" when the upper path is selected and a logic "1" when the lower path is selected. Similarly, the output of the SEL1 signal is a logic "0" when the upper path is selected and a logic "1" when the lower path is selected. Although not illustrated, the comparator 350 has associated therewith a multiplexer, with the comparator output selecting either the latch 318 or the latch 328 for output therefrom. The output of the SEL0 or SEL1 signal represents the decision of the comparators with the internal multiplexer (not shown) selecting the one of the two input latches for output to the output latch. As such, the SEL0 and SEL1-bit values represent which incoming path constitutes the most likely path, and this value is generated for each of the 256 nodes for each incoming symbol. Since each one of the nodes has a value of N associated therewith, and it has been determined that the decoded data will be a logic "0" when the node is even and a logic "1" value when the node is odd, traversing the most likely path merely requires examination of the SEL values.

Figure 12:
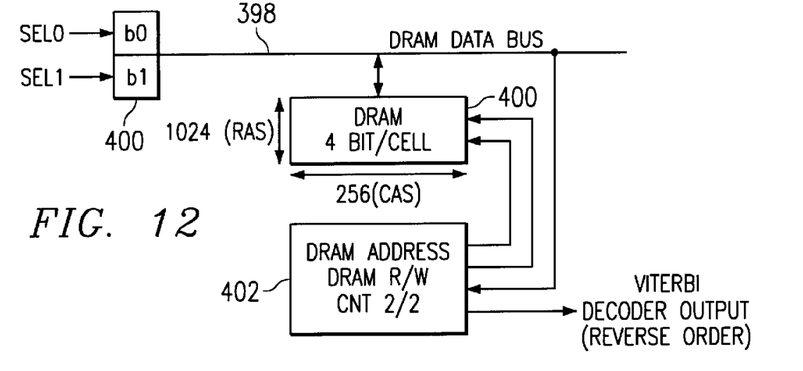
FIG. 12 illustrates a block diagram of the memory storage portion of the Viterbi decoder loop of FIG. 11.

Referring now to FIG. 12, there is illustrated a block diagram of the second portion of the Viterbi decoder loop. The two SEL0 and SEL1 bits are multiplexed onto a data bus 398 through registers 400. The data bus 398 is a 4-bit data bus and there is provided a multiplexer (not shown) for interfacing the SEL0 and SEL1 bits with the four bits of the data bus 398 such that the first two SEL bits are input to the two least significant bits (LSBs) of the data bus and the next two SEL bits are input to the two most significant bits (MSBs), as will be described hereinbelow. The data bus 398 is input to a Dynamic Random Access Memory (DRAM) 400. This memory 400 is organized such that there are provided four bits for each column address. In the illustrated DRAM 400, there are 1024 rows and 256 columns. For each clock cycle in the operation of the Viterbi decoder, there are generated the SEL0 and SEL1 bits. These correspond to two of the 256 nodes or 256 states for a given input symbol. As such, there must be generated 256 SEL bits for the given symbol indicating the most likely path going backwards from each of the associated nodes. Therefore, there will be required 128 clock cycles to cycle through all 256 nodes for a given received symbol. These are then stored sequentially in a single row of the DRAM 400. Therefore, a row will first be selected and then data will begin to be sequentially stored in the selected column, as the value of N is incremented.

Since the column address selects 4 bits, then there can be 4 bits stored therein. This is facilitated by first connecting the two registers 400 to the first and second least significant bits of the data bus 398. On the next clock cycle, the contents of the register 400 are connected to the third and fourth most significant bits of the data bus 398 such that they will be stored in the corresponding selected cells in the memory 400. In the next cycle, the column address is incremented and then the operation repeated. This will continue for 64 column addresses for a given symbol, such that a single symbol is associated with a single row. However, it should be understood that other row lengths could be accommodated. At the end of the row, the column address is 63. Rather than set the column address back to "0" for the next 256 SEL bits for the next symbol, the column address is decremented in a reverse direction for the purpose of saving time, after incrementing the row address. This will then store more symbols worth of SEL information in that new row. The operation will continue until all of the data for a given sequence is received.

In the decoding operation, the decoder need only operate in the reverse order; that is, it starts with the 256 nodes associated with the last symbol to be decoded, with the decoder having knowledge that the last state will be the state "0." It will then look only at this one state in order to determine which path it must traverse in the reverse direction. To do this, it merely needs to look at the SEL bit in that storage location associated with the "0" state for the last symbol. If the SEL bit is a logic "0," It will look to the upper path and, if it is a logic "1," it will go to the lower path. This is, in effect, a pointer for the reverse path. The decoder operation need only go to the information for the next 256 nodes at the pointed to node to determine the value thereof. If it is an even node, then the decoded output bit will be a "0" and if it is a odd node, the decoded output will be a logic "1." At this new node, the SEL bit for that node is read and then the decoder will go to the previous 256 bits stored in association with that previous symbol and read out the SEL bit therefor and output the decoded bit for the value associated therewith. This will continue for all of the symbols received. This therefore, provides the decoded output data. The entire memory is required to be traversed therethrough in order to read all of the information stored in the memory 400 for a given sequence of data received.

Figure 13:
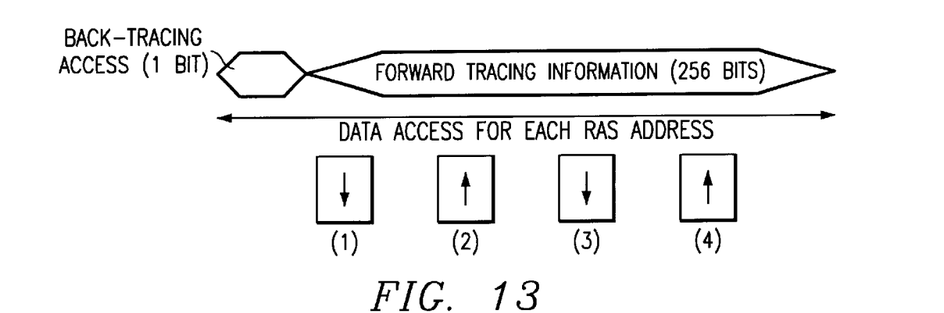
FIG. 13 illustrates a diagrammatic view for accessing a DRAM.

Referring now to FIG. 13, there is illustrated a diagrammatic view of the operation of the memory 400. This back tracing operation illustrates the manner in which data is taken out of the memory and then placed back into the memory. As noted hereinabove, the data is input in a serpentine manner such that the column address is incremented in one direction and then decremented in the other direction for storage. Once the information has been stored for a given sequence, then it must be decoded.

In FIG. 13, it can be seen that the first operation is a back tracing access to select the SEL bit for the most likely path. This is followed by the forward tracing information, wherein 256 SEL bits are stored. The back tracing operation decodes the previously stored SEL information in accordance with a back tracing operation of the trellis in the Viterbi decoding algorithm. The procedure is as follows:

When an entire sequence of data is received from an initialization of "0" to a tail of "0" symbols, then the back tracing operation is initiated. This back tracing operation takes into account the fact that it is known the last state is a "0." The first node of the last block of 256 SEL bits is read and, it being even, the decoded data will be a logic "0." Additionally, the SEL bit will tell the decoder where the next column address will be, i.e., whether to follow the upper or lower path to the N or N+128 node for the current node being the 2N or 2N+1 node. Therefore, if the row address were decremented in the backwards operation, then the column address pointed to would require only access of a single bit associated with the defined one of the lower or upper paths. The specific operations would be as follows:

1. Store the SEL information up to the last tail bit in the sequence.
2. Initiate the back tracing operation by defining the 8-bit column address as ($n_7$, $n_6$, $n_5$, $n_4$, $n_3$, $n_2$, $n_1$, $n_0$), wherein $n_7$ is the MSB. It is noted that there are 64 column addresses required to access the memory 400. However, since there are 4 bits, then the column address for the memory need only have 6 bits with the additional 4 bits required for selecting between the 4 bits per column address. This would require some pre-decoding operation which is not shown. This 8-bit address would therefore select a single bit in the row.
3. Set the address ($n_7$, $n_6$, $n_5$, $n_4$, $n_3$, $n_2$, $n_1$, $n_0$)=(0, 0, 0, 0, 0, 0, 0, 0). This is the address of the first node, since it is, as described hereinabove, known that the first node in the back tracing operation will be the "0" state.
4. The row address is set to the final row address where the SEL information is stored for a given sequence. This corresponds to the last stored symbol which is associated with a "0" data bit and this is known.
5. The SEL bit at this address is read, which indicates the most desired reverse path, i.e., the upper path or the lower path.
6. According to the SEL bit information, the new address is defined as follows:
   SEL=0 (upper path): (0, $n_7$, $n_6$, $n_5$, $n_4$, $n_3$, $n_2$, $n_1$); decoded output=0 when $n_1$, is even,=1 when odd.
   SEL=1 (lower path): (1, $n_7$, $n_6$, $n_5$, $n_4$, $n_3$, $n_2$, $n_1$); decoded output=0 when $n_1$, is even,=1 when odd.
7. Increment the row address in the reverse way by 1.
8. Repeat steps 5–6 until the row address comes back to the starting address.

With the above noted procedure, a decoded bit stream can be constructed along the most likely path which is traced backwards through the trellis. After the back tracing operation, all of the SEL information for that block can be written over for the new incoming data. This corresponds to the next set of convolutional codes. By repeating this forward and reverse memory access, a single memory can provide back tracing decoding and new SEL information storage in the economical way. It is noted in Step 6 hereinabove, that the SEL information always defines the address of the previous set of 256 nodes to which the trellis should traverse. The MSB will be "0" for the N path and "1" for the N+128 path back from the node, whether this node was the 2N node of the 2N+1 node.

It is noted that the output that is accessed from the implementation of FIG. 12 is in the reverse order due to the back tracing operation. An additional memory would be required to generate the data sequence in the normal order, i.e., "flip" the data stream.

Figure 14:
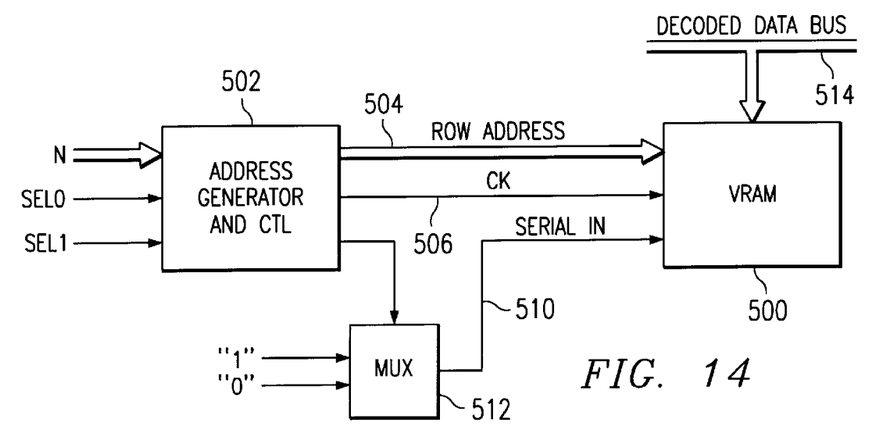
FIG. 14 illustrates an alternate embodiment utilizing a VRAM.

Referring now to FIG. 14, there is illustrated an alternate embodiment of the embodiment of FIG. 12, wherein a Video RAM (VRAM) 500 is utilized. The VRAM 500 is a typical video memory that is a commodity in the industry that is utilized for real-time video and graphics input/output. The internal structure of a VRAM allows access in two ways. In the first way, parallel access can be obtained to the memory array and, in the second manner, serial access can be obtained. Therefore, very typically, the VRAM is "pixel" mapped to a screen such that one line of pixels can be stored in a row. In this manner, an entire row of pixels corresponding to one line of the video screen can be output to a serial output shift register that has a length equal to one row. This information can then be serially output therefrom into the video display in sync with the raster of the display. While the shift register contents are being output, the row that was actually addressed and output to the shift register in the previous cycle can be updated.

The VRAM 500 is controlled, as will be described hereinbelow, to allow the actual decoded data to be built up into a row, as opposed to storing the SEL information. This is facilitated by initiating the operation on the first received symbol by storing the known data bit which is a "0." In subsequent cycles, there is provided a decoded data stream for each node, which data, if that node were determined to be the most likely path, would constitute the decoded data. By taking a new node out of the 256 possible nodes for a given received symbol and determining which path is the most likely for that node via the calculations of Equations 3 and 4, i.e., either the path from the N node in the previous symbol or the N+128 node therein, the decoded data for that node can have the decoded data associated with the new node appended thereto, this being a "0" decoded data bit for an even node (2N) or a "1" decoded data bit for an odd node (2N+1). Therefore, for each symbol received, a decoded data stream for each node or state can be accumulated through the trellis. This will continue until the last of the coded sequence has been received, at which time it is known that the only valid decoded data is that stored with respect to state "0."

Referring further to FIG. 14, there is provided an address generator and control circuit 502 which is operable to receive the value of N and also the SEL0 and SEL1 bits. These are utilized to generate the row address on an address bus 504. Additionally, the address generator and control circuit 502 generates timing signals via the control line 506 to provide the various controls of the two multi-ports on the VRAM 500. The serial input of the VRAM 500 is connected to a serial input bus 510, which is operable to receive either a "1" or a "0" value selectable by a multiplexer 512. The multiplexer 512 is controlled by the address generator and control circuit 502. The VRAM 500 is operable to output parallel decoded data on a decoded data bus 514.

Referring now to FIGS. 15a–15d, there are illustrated four sequential diagrammatic views of the manner in which decoded data is accumulated. The VRAM 500 is divided into two blocks of memory, each arranged with 1024 columns and 256 rows, these being an upper section 520 and a lower section 522. In addition, there is provided a shift register 524. The diagrammatic descriptions in FIGS. 15a–15d will be utilized in the following process flow for the operation.

Figure 15A:
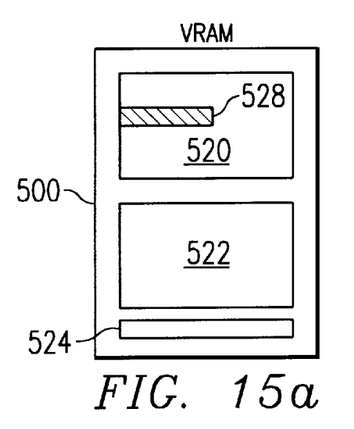
FIGS. 15a–15d illustrates four diagrammatic views of the operation of the VRAM.

In the first step of the process flow, the path metric comparison is done for a given received symbol at each of the nodes to determine whether the upper path or the lower path for a given node is selected, this being determined by the value in the SEL1 and the SEL0 bits. Once the path metric is determined for a give node, the given node (2N or 2N+1) then knows which of the previous nodes (N or N+128) it will flow from. For the given node (2N or 2N+1), after the path metrics have been determined, the value of the determined upper branch (flowing from N) or lower branch (flowing from N+128) is selected from the upper block 520 in the present example, depending upon the values of SEL1 and SEL2. In FIG. 15a, a previous decoded set of data is stored in a location 528, this being the state of the decoded data at the node N (upper path) or N+128 (lower path) for the received symbol at node 2N or 2N+1. This constitutes a string of decoded data for that node N or N+128 calculated when the previous symbol was received.

Figure 15B:
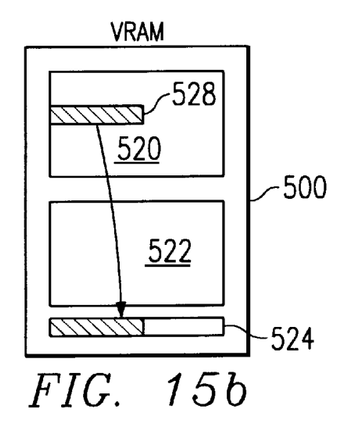
Figure 15C:
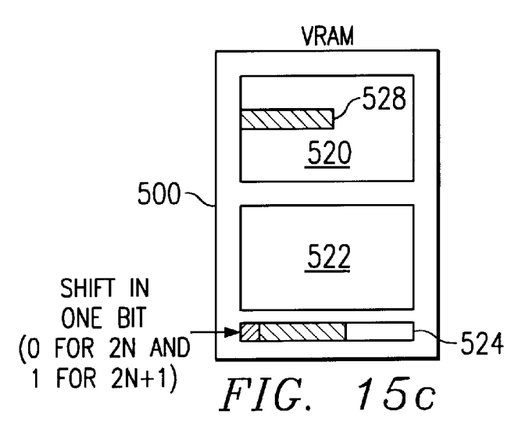

In this first step, as illustrated in FIG. 15b, the contents of the addressed location 528 would be downloaded to the shift register 522. This address is defined by first selecting a node for the received symbol, and then determining if it is even (the 2N node) or odd (the 2N+1 node). The branch metrics are then calculated and then the upper path (N) or the lower path (N+128) determined as the most likely path. This value, N or N+128, will be the address of the location 528. It is important to note that the data stored in the shift register at this point constitutes the decoded data for the previously received symbol.

Once the information has been loaded to the shift register 522 in the previous step illustrated in FIG. 15b, then it is necessary to determine for the given node (2N or 2N+1), whether the given node is odd or even. If it is even, then a "0" is shifted into the shift register 524 with the multiplexer 512. Note that now the length of the data stream in the shift register 524 is one bit longer than that in the storage location 528. This now reflects the decoded data stream at that given node (2N or 2N+1) and the associated symbol with the received sequence of data.

Figure 15D:
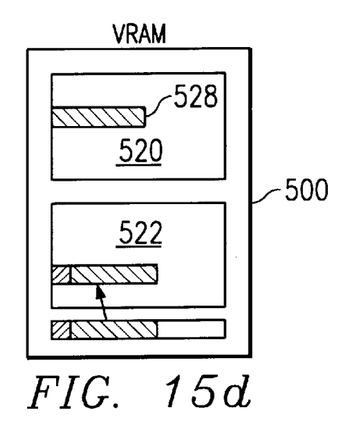

Once the decoded data bit has been shifted into the shift register 524 for a given node, then the resulting decoded bit stream in shift register 524 is transferred to the lower block 522 in the VRAM 500, as illustrated in FIG. 15d. This address will either be an even address (2N) or an odd address (2N+1) and will be related to the Equations 3 and 4.

Once the decoded data for one node of a given received symbol has been determined, then the value of 2N or 2N+1 is incremented and then new branch metrics for that new node of 2N+1 or 2N calculated, the most likely previous node N or N+128 determined and the decoded data stream for that node retrieved and then the appropriate data bit appended thereto followed by storage back into the lower block 522. This continues for all 256 nodes associated with the received symbol. When the next symbol is received, it is only necessary to alternate the operation such that the data is now retrieved from block 522 for shifting into the shift register 524 and then data from shift register 524 shifted up to the appropriate location in the block 520. In this operation with the VRAM no back tracing is necessary to obtain the decoded bit stream, since the decoded results are stored directly in the form of the decoded bit stream. However, the SEL0 and SEL1 information needs to be processed one at a time for each operation of the VRAM 500.

In summary, there has been provided an implementation of a Viterbi algorithm that utilizes minimum memory. In the first aspect, FIFOs are utilized to calculate the branch metrics and then, once calculated, they are stored in a single memory such that minimal memory is required for the overall operation. This is facilitated by the Viterbi algorithm, which essentially alleviates the requirement to remember the least likely path at each node, wherein only a single back path is necessary at each node.

What is claimed is:

1. A method for decoding an encoded data sequence with a Viterbi algorithm, wherein convolutionally encoded symbols are transmitted and received, comprising the steps of:

receiving the encoded data sequence with the encoded data sequence having a known state of the convolutional encoding process at the end of the sequence;

building a table of information nodes for each received symbol and each state of the convolutional encoding process, there being M states and M nodes and, for each state and corresponding node associated with each received symbol, there being associated therewith a decoded data bit and a path pointer to the most likely state and corresponding node associated with the preceding received symbol;

extracting a decoded data word from the information in the table by the steps of:

a) selecting from the table associated with the last received symbol at the end of the sequence a node corresponding to a known state therefor that constitutes a selected node;

b) extracting the data bit from the selected node and appending the extracted data bit to a decoded data word;

c) traversing from the selected node for the associated symbol to the state and corresponding node of the preceding symbol indicated by the path pointer for the selected node; and repeat steps b) and c) for each received symbol until the data for the first symbol is examined and the associated decoded data bit is appended to the decoded data word.

2. The method of claim 1, and further comprising the step of inverting the sequence of the assembled decoded data word to provide an output data word.

3. The method of claim 1, wherein the known state at the end of the sequence corresponds to a "0" data bit.

4. The method of claim 3, wherein the convolutional encoding operation has a plurality of delays associated therewith of length "n" such that the number of states in the convolutional coder is set equal to $2^n$=M and the sequence at the end of the data sequence comprises a string of n "0's".

5. The method of claim 1, wherein the step of building the table comprises:

providing a memory configured such that each received symbol corresponds to a row and each state associated with each symbol corresponds to a column address in the associated row;

storing with each column address in the row associated with each received symbol a data bit indicating the most likely path to the node and associated column address for the previously received symbol;

wherein the column address in each row has a value N that varies from "1" to "M" corresponding to M states and the data value for the decoded data bit associated with each node and corresponding state having the value N, is a "1" for either an even or an odd state and a "0" for the other of the even or odd states such that the value of N (even or odd) provides the decoded data bit for the selected state in the selected row at the selected column address.

6. The method of claim 5, wherein the step of building comprises:

processing each received symbol through a Viterbi algorithm to determine for each associated state the most likely path to a state and corresponding node associated with the previously received symbol and representing that most likely path with a bit indicating whether it is to an even or odd state.

7. The method of claim 6, wherein the path to the state of the previously received symbol is either equal to the state of the processed symbol or the state of the processed symbol plus N/2.

8. The method of claim 7, wherein the Viterbi algorithm for processing the received symbol is as follows:

$$\text{metric}(2N) = \min[\text{metric}(N) + d(\text{symbol}, m(N)), \text{metric}(N+128) + d(\text{symbol}, 7-m(N))]$$

$$\text{metric}(2N+1) = \min[\text{metric}(N) + d(\text{symbol}, 7-m(N)), \text{metric}(N+M/2) + d(\text{symbol}, m(N))]$$

wherein:
metric(2N)=the path metric for the even node associated with the currently received symbol,
metric(2N+1)=the path metric for the odd node associated with the currently received symbol,
metric(N)=the path metric for the previously received symbol,
metric(N+M/2)=the path metric for the node N+M/2,
"symbol" is representative of the received symbol,
m(N) is the convolutional encoder output for the state N and input 0, and
d(symbol, 7−m(N)) and d(symbol, m(N))=branch metric for the associated path between symbols.

9. The method of claim 8, wherein the equations for the 2N and 2N+1 are calculated in parallel such that the path metric for even states and the path metric for odd states is calculated and a decision made after the calculation as to the most likely path and this new path metric replacing the previous path metric.

10. The method of claim 9, wherein the step of calculating the Viterbi algorithm comprises:

storing each path metric in a FIFO;

extracting the path metric from the associated FIFO for each operation to add the calculated branch metric thereto to provide a new path metric for each node from two previous node associated with the previously received symbol, and comparing the new path metrics for the associated even and odd nodes and selecting the most likely path at each of the even and odd nodes;

storing the most likely path back in the corresponding 2N or 2N+1 location for the processed N state;

incrementing and repeating the calculation for N ranging from "0" to $N_{max}$, a maximum value for N of M.

11. A method for decoding a decoded data sequence wherein convolutionally encoded symbols are transmitted and received, comprising the steps of:

receiving the encoded data sequence, with the encoded data sequence having associated for each received encoded symbol M states;

storing for each of the M states a decoded data word;

calculating path metrics for each state N ranging from "0" to "M", for a given received symbol after the initial received symbol;

determining for each state N for the given received symbol the most likely path to a state N' associated with the previously received symbol, N' different from N;

retrieving the decoded data word associated with the determined state N' associated with the previous received symbol;

appending a data bit associated with the N state of the given received symbol to the retrieved data word from the N' state from the previously received symbol to provide an updated data word;

storing the updated data word in association with the Nth state; and wherein, for each state associated with the last received symbol, there will be a decoded data word, and wherein the last the received symbol comprises a known state.

12. The method of claim 11, wherein the step of determining for each state N for the given received symbol the most likely path, comprises determining for each state N for the given received symbol the most likely path to the data associated with a previously received symbol in accordance with a Viterbi algorithm.

13. The method of claim 11, wherein the data bit for each node comprises either a "1" or a "0" for a even value of N and the other to of the "1" or "0" for an odd value of N.

14. A decoder for decoding an encoded data sequence with a Viterbi algorithm, wherein convolutionally encoded symbols are transmitted and received, comprising:

an input for receiving the encoded data sequence with the encoded data sequence having a known state of the convolutional encoding process at the end of the sequence;

a decoder element for building a table of information nodes, one node for each received symbol and each state of the convolutional encoding process, there being M states and M nodes and, for each state and corresponding node associated with each received symbol, there being associated therewith a decoded data bit and a path pointer to the most likely state and corresponding node associated with the preceding received symbol;

an extractor for extracting a decoded data word from the information in the table which is operable to:

a) select from the table associated with the last received symbol at the end of the sequence a node corresponding to a known state therefor that constitutes a selected node;

b) extract the data bit from the selected node and append the extracted data bit to a decoded data word;

c) traverse from the selected node for the associated symbol to the state and corresponding node of the preceding symbol indicated by the path pointer for the selected node; and repeat the extraction operation and the traverse operation for each received symbol until the data for the first symbol is examined and the associated decoded data bit is appended to the decoded data word.

15. The decoder of claim 14, and further comprising a data word inverter for inverting the sequence of the assembled decoded data word to provide an output data word.

16. The decoder of claim 14, wherein the known state at the end of the sequence corresponds to "0" data bit.

17. The decoder of claim 16, wherein the convolutional encoding operation has a plurality of delays associated therewith of length "n" such that the number of states in the convolutional coder is set equal to $2^n=M$ and the sequence at the end of the data sequence comprises a string of n "0's".

18. The decoder of claim 14, wherein said table comprises:
 a memory configured such that each received symbol corresponds to a row and each state associated with each symbol corresponds to a column address in the associated row; and
 an address controller for storing with each column address in the row associated with each received symbol a data bit indicating the most likely path to the node and associated column address for the previously received symbol;
 wherein the column address in each row has a value N that varies from "1" to "M" corresponding to M states and the data value for the decoded data bit associated with each node and corresponding state having the value N, is a "1" for either an even or an odd state and a "0" for the other of the even or odd states such that the value of N (even or odd) provides the decoded data bit for the selected state in the selected row at the selected column address.

19. The decoder of claim 18, wherein said decoder comprises:
 a Viterbi decoder for processing each received symbol through a Viterbi algorithm to determine for each associated state the most likely path to a state and corresponding node associated with the previously received symbol and representing that most likely path with a bit indicating whether it is to an even or odd state.

20. The decoder of claim 19, wherein the path to the state of the previously received symbol is either equal to the state of the processed symbol or the state of the processed symbol plus N/2.

21. The decoder of claim 20, wherein said Viterbi algorithm for processing the received symbol is as follows:

$$\text{metric}(2N)=\min[\text{metric}(N)+d(\text{symbol}, m(N)), \text{metric}(N+128)+d(\text{symbol}, 7-m(N))]$$

$$\text{metric}(2N+1)=\min[\text{metric}(N)+d(\text{symbol}, 7-m(N)), \text{metric}(N+M/2)+d\text{symbol}, m(N))]$$

wherein:
 metric(2N)=the path metric for the even node associated with the currently received symbol,
 metric(2N+1)=the path metric for the odd node associated with the currently received symbol,
 metric(N)=the path metric for the previously received symbol,
 metric(N+M/2)=the path metric for the node N+M/2,
 "symbol" is representative of the received symbol, m(N) is the convolutional encoder output for the state N and input 0, and
 d(symbol, 7−m(N)) and d(symbol, m(N))=branch metric for the associated path between symbols.

22. The decoder of claim 21, wherein the equations for the 2N and 2N+1 are calculated in parallel such that the path metric for even states and the path metric for odd states is calculated and a decision made after the calculation as to the most likely path and this new path metric replacing the previous path metric.

23. The decoder of claim 22, wherein said Viterbi decoder comprises:
 a FIFO for storing each path metric;
 a FIFO extractor for extracting the path metric from said associated FIFO for each operation to add the calculated branch metric thereto to provide a new path metric for each node from two previous node associated with the previously received symbol, and a comparator for comparing the new path metrics for the associated even and odd nodes and selecting the most likely path at each of the even and odd nodes;
 a feedback device for storing the most likely path back in the corresponding 2N or 2N+1 location for the processed N state;
 a controller for incrementing and repeating the calculation for N ranging from "0" to $N_{max}$, a maximum value for N of M.

24. A decoder for decoding a decoded data sequence wherein convolutionally encoded symbols are transmitted and received, comprising:
 an input for receiving the encoded data sequence, with the encoded data sequence having associated for each received encoded symbol M states;
 a memory for storing in association with each of the M states a decoded data word;
 means for calculating path metrics for each state N ranging from "0" to "M", for a given received symbol after the initial received symbol;
 means for determining for each state N for the given received symbol the most likely path to a state N' associated with the previously received symbol, N' different from N;
 means for retrieving the decoded data word associated with the determined state N' associated with the previous received symbol from said memory;
 means for appending a data bit associated with the N state of the given received symbol to the retrieved data word from the N' state from the previously received symbol to provide an updated data word and storing the updated data word in said memory in association with the Nth state; and
 wherein, for each state associated with the last received symbol, there will be a decoded data word, and wherein the last the received symbol comprises a known state.

25. The decoder of claim 24, wherein said means for determining N is operable to determine for each state N for the given received symbol the most likely path to the data associated with a previously received symbol in accordance with a Viterbi algorithm.

26. The decoder of claim 24, wherein the data bit for each node comprises either a "1" or a "0" for a even value of N and the other to of the "1" or "0" for an odd value of N.

* * * * *